(12) United States Patent
De Silva et al.

(10) Patent No.: US 10,586,697 B2
(45) Date of Patent: Mar. 10, 2020

(54) WET STRIPPABLE OPL USING REVERSIBLE UV CROSSLINKING AND DE-CROSSLINKING

(71) Applicant: International Business Machines Corporation, Armonk, NY (US)

(72) Inventors: Ekmini A. De Silva, Slingerlands, NY (US); Nelson Felix, Slingerlands, NY (US); Jing Guo, Niskayuna, NY (US); Indira Seshadri, Niskayuna, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/424,950

(22) Filed: May 29, 2019

(65) Prior Publication Data

US 2019/0295841 A1    Sep. 26, 2019

Related U.S. Application Data

(62) Division of application No. 15/869,258, filed on Jan. 12, 2018, now Pat. No. 10,388,510.

(51) Int. Cl.
*H01L 21/02* (2006.01)
*H01L 21/321* (2006.01)
(Continued)

(52) U.S. Cl.
CPC ........ *H01L 21/02074* (2013.01); *G03F 7/091* (2013.01); *G03F 7/094* (2013.01);
(Continued)

(58) Field of Classification Search
CPC ......... H01L 21/02074; H01L 21/28088; H01L 21/32115; H01L 29/4966; H01L 29/0649; H01L 29/7851; G03F 7/091; G03F 7/094
See application file for complete search history.

(56) References Cited

U.S. PATENT DOCUMENTS

| 8,426,111 B2 | 4/2013 | Takei et al. |
| 9,134,610 B2 | 9/2015 | Takei et al. |

(Continued)

OTHER PUBLICATIONS

Chen et al. "Copolymers derived from 7-acryloyloxy-4-methylcoumarin and acrylates: 1. Copolymerizability and photocrosslinking behaviours," Polymer, vol. 37, No. 20, 1996, pp. 4473-4480.

(Continued)

*Primary Examiner* — Thanh T Nguyen
(74) *Attorney, Agent, or Firm* — Cantor Colburn LLP; Vazken Alexanian

(57) ABSTRACT

Embodiments of the present invention are directed to the wet stripping of an organic planarization layer (OPL) using reversible UV crosslinking and de-crosslinking. In a non-limiting embodiment of the invention, an interlayer dielectric is formed over a substrate. A trench is formed in the interlayer dielectric. A work function metal is formed over the interlayer dielectric such that a portion of the work function metal partially fills the trench. A UV sensitive OPL is formed over the work function metal such that a portion of the UV sensitive OPL fills the trench. The UV sensitive OPL can be crosslinked by applying light at a first UV frequency and de-crosslinked by applying light at a second UV frequency.

20 Claims, 9 Drawing Sheets

(51) Int. Cl.

| | | |
|---|---|---|
| *H01L 29/49* | (2006.01) | |
| *G03F 7/09* | (2006.01) | |
| *H01L 21/28* | (2006.01) | |
| *G03F 7/095* | (2006.01) | |
| *H01L 21/3105* | (2006.01) | |
| *H01L 21/027* | (2006.01) | |
| *H01L 21/3213* | (2006.01) | |
| *H01L 21/311* | (2006.01) | |
| *H01L 29/06* | (2006.01) | |
| *H01L 29/78* | (2006.01) | |

(52) U.S. Cl.
CPC .......... *G03F 7/095* (2013.01); *H01L 21/0271* (2013.01); *H01L 21/28088* (2013.01); *H01L 21/31058* (2013.01); *H01L 21/31133* (2013.01); *H01L 21/32115* (2013.01); *H01L 21/32139* (2013.01); *H01L 29/4966* (2013.01); *H01L 29/0649* (2013.01); *H01L 29/7851* (2013.01)

(56) References Cited

U.S. PATENT DOCUMENTS

| | | | |
|---|---|---|---|
| 9,417,520 | B2 | 8/2016 | Koh et al. |
| 10,083,832 | B1 | 9/2018 | Liu et al. |
| 2003/0003407 | A1* | 1/2003 | Ko .................. G03F 7/40 430/328 |
| 2005/0214674 | A1 | 9/2005 | Sui et al. |
| 2006/0183055 | A1* | 8/2006 | O'Neill ............. H01L 21/02126 430/316 |
| 2009/0111057 | A1 | 4/2009 | Xu et al. |
| 2009/0162782 | A1 | 6/2009 | Takei et al. |
| 2011/0003250 | A1 | 1/2011 | Amara et al. |
| 2012/0122029 | A1 | 5/2012 | Kudo et al. |
| 2013/0113086 | A1 | 5/2013 | Bai et al. |
| 2017/0052450 | A1* | 2/2017 | Nakagawa ............ G03F 7/2032 |
| 2017/0213722 | A1* | 7/2017 | Weng .................. G03F 7/40 |

OTHER PUBLICATIONS

Chen et al. "Photopolymerization of 7,7'-Coumarinyl Polymethylene Dicarboxylates: Fluorescence and Kinetic Study," Journal of Polymer Science: Part A: Polymer Chemistry, vol. 35, 1997, pp. 2999-3008.

Chen et al. "Polyethers Containing Coumarin Dimer Components in the Main Chain. II. Reversible Photocleavage and Photopolymerization," Journal of Applied Polymer Science, vol. 64, 1997, pp. 1759-1768.

Chen et al. "Synthesis and Reversible Photocleavage of Novel Polyurethanes Containing Coumarin Dimer Components," Journal of Polymer Science: Part A: Polymer Chemistry, vol. 35, 1997, pp. 613-624.

Chujo et al. "Photogelation and Redox Properties of Anthracene-Disulfide-Modified Polyoxazolines," Macromolecules, vol. 26, No. 21, 1993, pp. 5611-5614.

Chujo et al., "Polyoxazoline Having a Coumarin Moiety as a Pendant Group. Synthesis and Photogelation," Macromolecules 23.10, 1990, pp. 2693-2697.

Chung et al. "Crack Healing in Polymeric Materials via Photochemical [2+2] Cycloaddition," Chem. Mater. vol. 16, No. 21, 2004, pp. 3982-3984.

Froimowicz et al. "Towards the Generation of Self-Healing Materials by Means of a Reversible Photo-induced Approach," Macromolecular Rapid Communications 32, No. 5, 2011, pp. 468-473.

Ghosh et al. "Self-Repairing Oxetane-Substituted Chitosan Polyurethane Networks," Science, vol. 323, No. 5920, 2009, pp. 1458-1460.

Habault et al. "Light-triggered self-healing and shape-memory polymers," Chemical Society Review, vol. 42, 2013, pp. 7244-7256.

Ling et al. "Coumarin imparts repeated photochemical remendability to polyurethane," Journal of Materials Chemistry, vol. 21, No. 45, 2011, pp. 18373-18380.

Ling et al. "Photo-stimulated self-healing polyurethane containing dihydroxyl coumarin derivatives," Polymer, vol. 53, No. 13, 2012, pp. 2691-2698.

List of IBM Patents or Patent Applications Treated as Related; (Appendix P), Date Filed May 29, 2019; 2 pages.

Trenor et al. "Coumarins in Polymers: From Light Harvesting to Photo-Cross-Linkable Tissue Scaffolds," Chem. Rev. 104, No. 6, 2004, pp. 3059-3077.

* cited by examiner

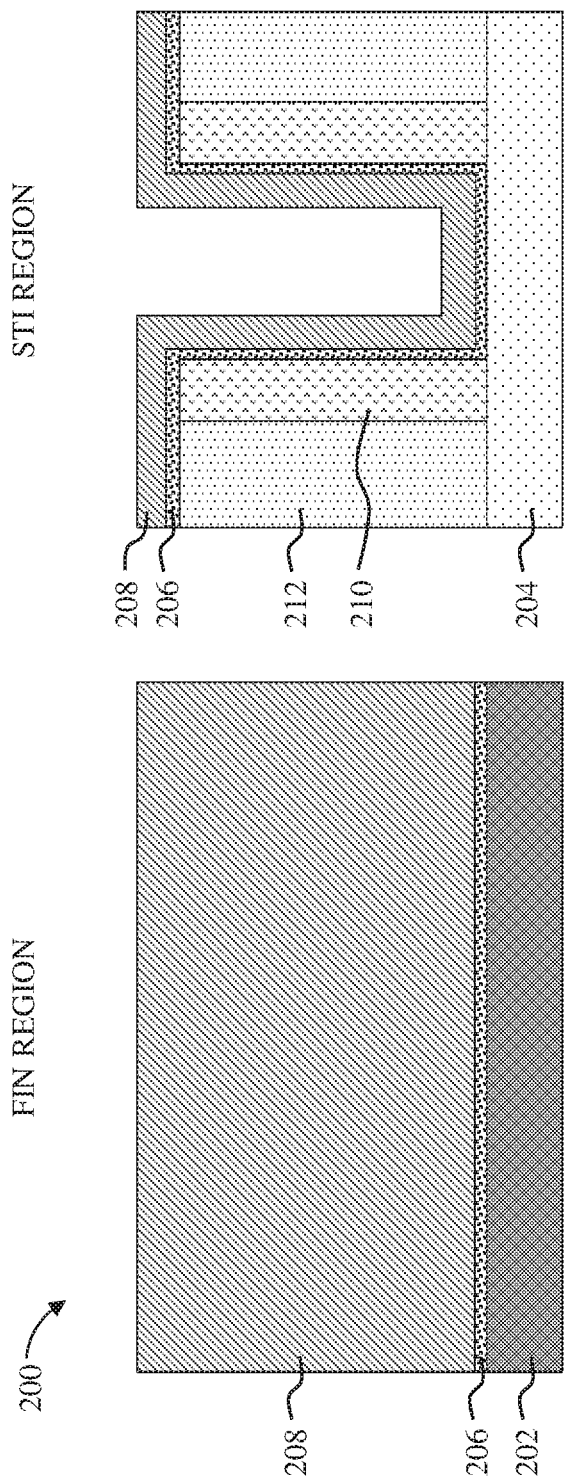

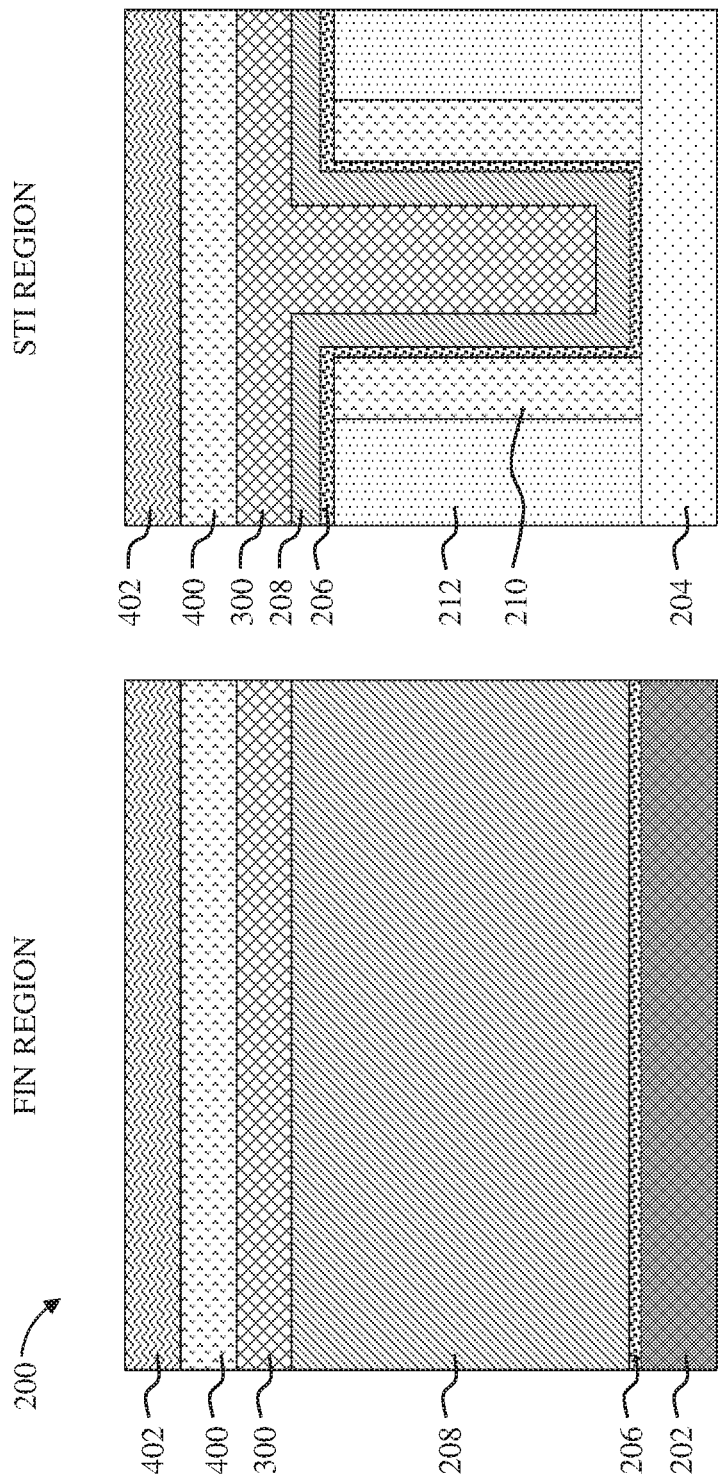

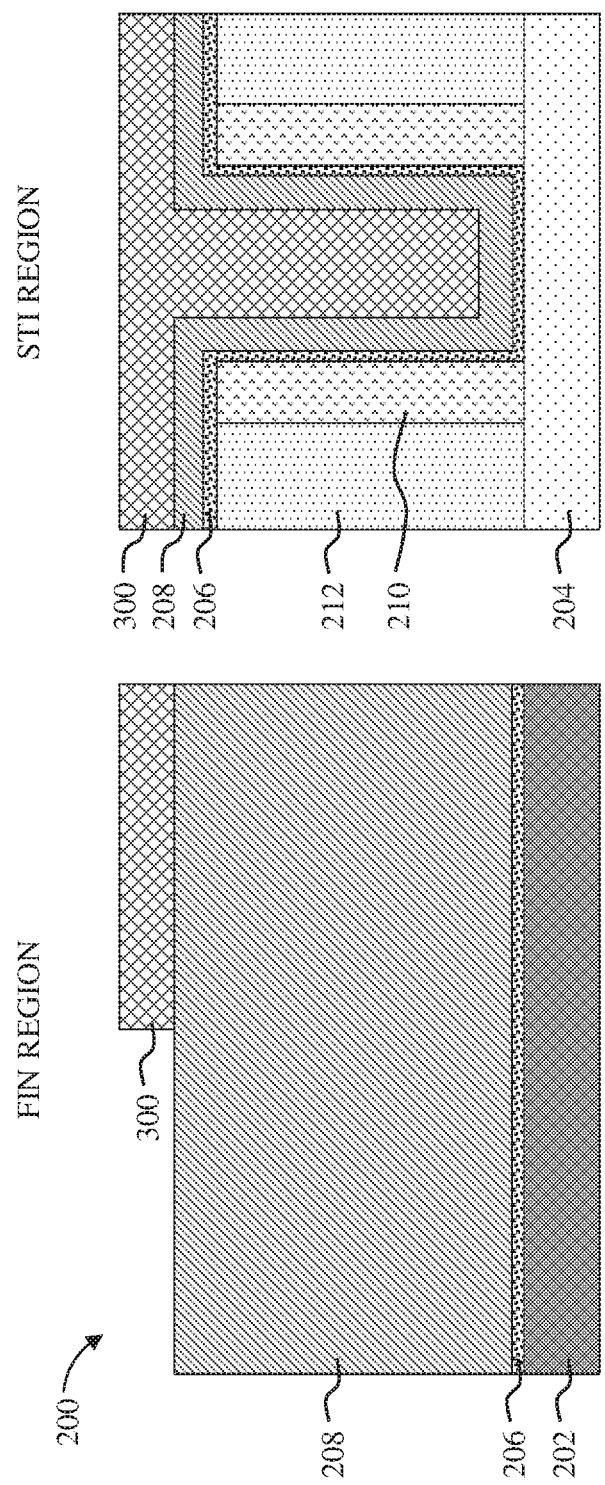

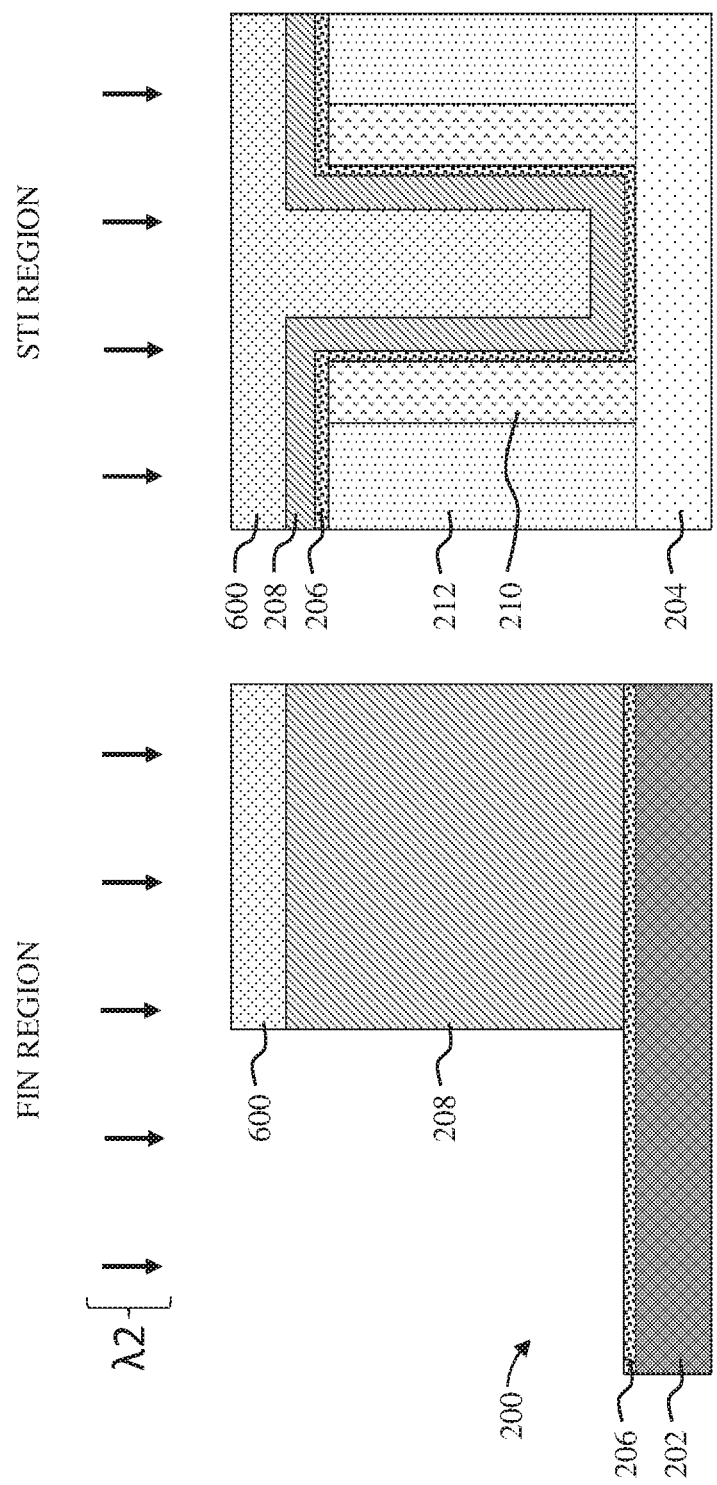

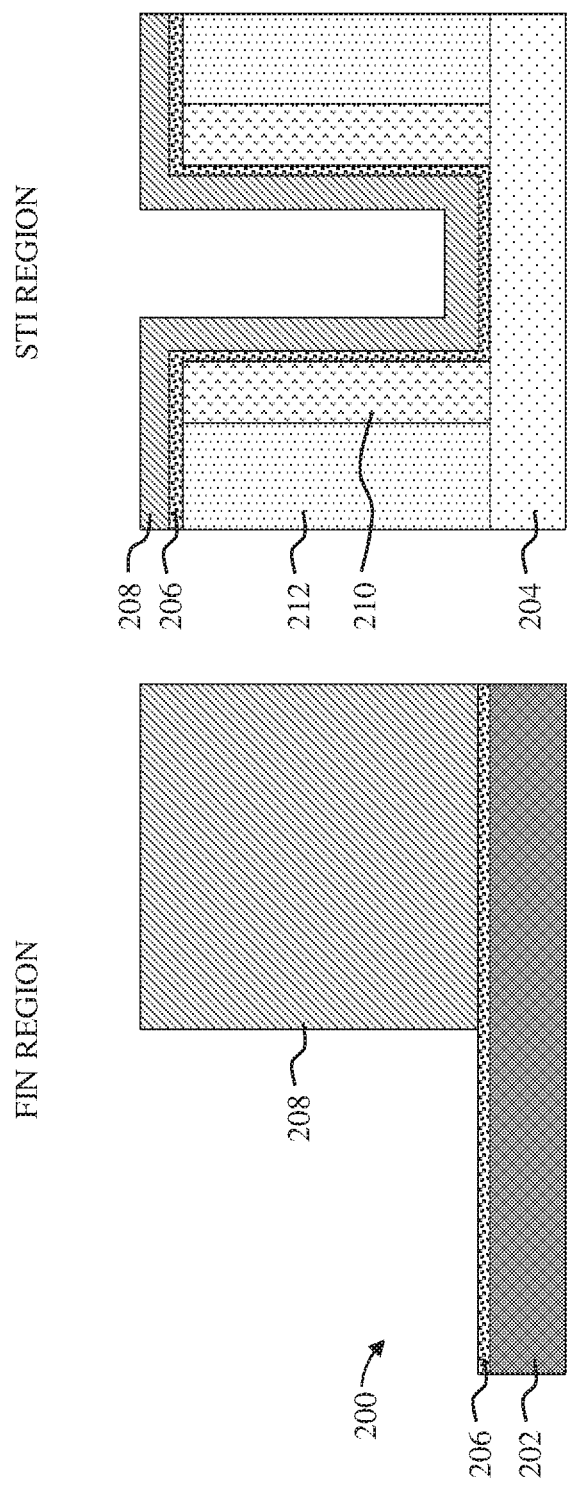

WET STRIPPABLE OPL USING REVERSIBLE UV CROSSLINKING AND DE-CROSSLINKING

DOMESTIC PRIORITY

This application is a divisional of U.S. application Ser. No. 15/869,258, titled "WET STRIPPABLE OPL USING REVERSIBLE UV CROSSLINKING AND DE-CROSSLINKING" filed Jan. 12, 2018, the contents of which are incorporated by reference herein in its entirety.

BACKGROUND

The present invention generally relates to fabrication methods and resulting structures for semiconductor devices. More specifically, the present invention relates to the wet stripping of an organic planarization layer (OPL) by using ultraviolet (UV) light/rays to reversibly crosslink and de-crosslink the OPL.

Traditional CMOS (Complementary Metal Oxide Semiconductor) fabrication techniques include process flows for constructing planar transistors. The density of planar transistors can be increased by decreasing the pitch between transistor gate elements. However, the ability to decrease gate pitch in planar transistors is limited by the required gate length and spacer thickness. Nonplanar transistor architectures, such as vertical field effect transistors (VFETs) and stacked nanotube field effect transistors (FETs), employ semiconductor channels with various gate-all-around (GAA) technologies to achieve increased device density, greater power efficiency, and some increased performance over lateral devices. Photolithography is the predominant technique used to pattern these ultrafine structures. Photolithography techniques involve the patterning of a thin photoresist layer and the transfer of the resulting photoresist pattern into a substrate.

SUMMARY

Embodiments of the present invention are directed to a method for wet stripping an organic planarization layer (OPL) using reversible UV crosslinking and de-crosslinking. A non-limiting example of the method includes forming an interlayer dielectric over a substrate. A trench is formed in the interlayer dielectric. A work function metal is formed over the interlayer dielectric such that a portion of the work function metal partially fills the trench. A UV sensitive OPL is formed over the work function metal such that a portion of the UV sensitive OPL fills the trench. The UV sensitive OPL can be crosslinked by applying light at a first UV frequency and de-crosslinked by applying light at a second UV frequency.

Embodiments of the present invention are directed to a method for wet stripping an OPL using reversible UV crosslinking and de-crosslinking. A non-limiting example of the method includes forming a UV sensitive OPL over a substrate. The UV sensitive OPL is crosslinked and an antireflective coating is formed over the crosslinked UV sensitive OPL. A photoresist is formed over the antireflective coating. A portion of the crosslinked UV sensitive OPL is removed to expose a surface of the substrate. The UV sensitive OPL is de-crosslinked and removed.

Embodiments of the invention are directed to a semiconductor device. A non-limiting example of the semiconductor device includes a work function metal formed over a substrate. A UV sensitive organic planarization layer (OPL) is formed over the work function metal. The UV sensitive OPL includes a functional group that can be crosslinked by applying light at a first UV frequency and de-crosslinked by applying light at a second UV frequency.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 2A depicts a cross-sectional view of a semiconductor structure after a processing operation according to one or more embodiments of the invention;

FIG. 2B depicts a cross-sectional view of the semiconductor structure after a processing operation according to one or more embodiments of the invention;

FIG. 4A depicts a cross-sectional view of the semiconductor structure after a processing operation according to one or more embodiments of the invention;

FIG. 4B depicts a cross-sectional view of the semiconductor structure after a processing operation according to one or more embodiments of the invention;

FIG. 5A depicts a cross-sectional view of the semiconductor structure after a processing operation according to one or more embodiments of the invention;

FIG. 5B depicts a cross-sectional view of the semiconductor structure after a processing operation according to one or more embodiments of the invention;

FIG. 6A depicts a cross-sectional view of the semiconductor structure after a processing operation according to one or more embodiments of the invention;

FIG. 6B depicts a cross-sectional view of the semiconductor structure after a processing operation according to one or more embodiments of the invention;

FIG. 7A depicts a cross-sectional view of the semiconductor structure after a processing operation according to one or more embodiments of the invention;

FIG. 7B depicts a cross-sectional view of the semiconductor structure after a processing operation according to one or more embodiments of the invention;

Figure 1:
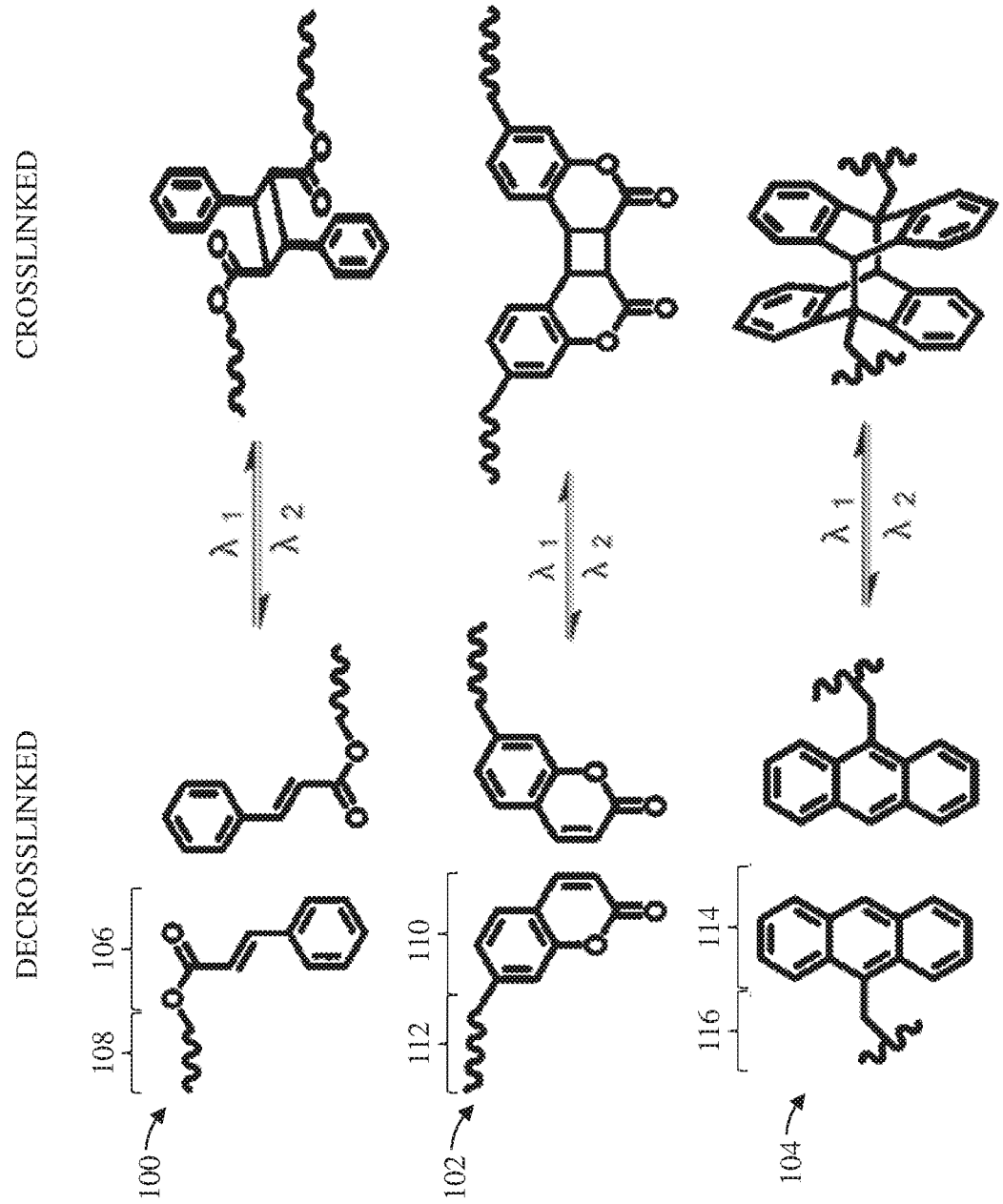
FIG. 1 depicts three exemplary UV sensitive OPL materials for enabling reversible crosslinking/de-crosslinking according to one or more embodiments of the present invention.

The diagrams depicted herein are illustrative. There can be many variations to the diagram or the operations described therein without departing from the spirit of the invention. For instance, the actions can be performed in a differing order or actions can be added, deleted or modified.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the present invention, as previously noted herein, photolithography is the predominant technique used to pattern high-density nonplanar transistor architectures such as vertical field effect transistors (VFETs) and stacked nanotube field effect transistors (FETs). The progressive decrease in these device feature sizes and steady increase in device integration requirements have only increased the demands on photolithography. As semiconductor device critical dimensions continuously scale downward, device fabricators have turned to the development of improved resolution multilayer photoresists. These multilayer photoresists typically include organic planarization layers (OPLs) because high resolution photoresists themselves often do not provide enough etch resistance for pattern transfer. OPLs are used as etch masks for pattern transfers into inorganic substrates, to fill pre-existing features, and to planarize the substrate to allow for larger patterning process windows. There are challenges, however, in scaling conventional photolithography techniques beyond the 10 nm node. One such challenge is the difficulty in cleanly removing the OPL after patterning the substrate.

Conventional OPL layers are typically removed by a dry removal process, such as a reactive ion etch (RIE) or plasma ash. These dry removal processes, however, can result in damage to the underlying structure or substrate, impacting device yields and performance. Wet based removal processes are potentially less damaging, but conventional OPL can only be wet stripped in a sulfuric acid (H2SO4) and hydrogen peroxide (H2O2) mixture (known as SPM), and applications are very limited. Complicating matters further, SPM cannot be used when work function metals (WFMs) are exposed.

Turning now to an overview of aspects of the present invention, one or more embodiments of the invention provide a novel method for using a wet strippable organic planarization layer (OPL) to improve photolithography. This wet strippable (solvent strippable) OPL leverages "UV sensitive" OPL materials to enable a selective wet strip through a reversible de-crosslinking reaction. A "UV sensitive" OPL material, as used herein, refers to an OPL that can be reversibly crosslinked (and de-crosslinked) by exposing the OPL to specific UV frequencies. In other words, these UV sensitive OPL materials can be crosslinked using a first frequency and de-crosslinked using a second frequency. The wet strippable OPL described herein can be cleanly removed without resorting to a dry removal process (RIE or plasma ash) and without requiring SPM. This wet strippable OPL also improves clean removal from small trenches (i.e., trenches having less than 10 nm critical dimensions) over that possible using conventional OPL processes.

Turning now to a more detailed description of aspects of the present invention, FIG. 1 depicts three exemplary UV sensitive OPL materials 100, 102, and 104, respectively, for enabling reversible crosslinking/de-crosslinking according to one or more embodiments of the present invention. As depicted in FIG. 1, the first UV sensitive OPL material 100 includes a cinnamoyl functional group 106 bonded to a polymer main chain 108. The second UV sensitive OPL material 102 includes a coumarin functional group 110 bonded to a polymer main chain 112. The third UV sensitive OPL material 104 includes an anthracene functional group 114 bonded to a polymer main chain 116. These three exemplary UV sensitive OPL materials 100, 102, and 104 are provided for ease of discussion and it is understood that any UV sensitive OPL material capable of a UV reversible crosslink and de-crosslink can be used in one or more embodiments of the present invention.

The polymer main chains 108, 112, and 116 can include any suitable material, such as, for example, polystyrenes, polyethylenes, polyacrylates, polyamides, polyethers, polyesters, poly(N-acetylethylenimine), polyurethanes, and polyoxazoline. The particular polymer chosen for a given application will vary and is selected to accommodate solubility during a subsequent OPL wet strip, discussed in further detail herein. Moreover, the feed ratio of monomer with and without UV crosslinkable moiety could vary in order to accommodate solubility and material performance.

In some embodiments of the present invention, the first frequency (λ1) for crosslinking the UV sensitive OPL materials 100, 102, and 104 is about 365 nm, although the exact crosslinking frequency will vary depending on the OPL material used, and other frequencies are within the contemplated scope of the invention. In some embodiments of the present invention, the second frequency (λ2) for de-crosslinking the UV sensitive OPL materials 100, 102, and 104 is about 248 nm, although the exact de-crosslinking frequency will vary depending on the OPL material used, and other frequencies are within the contemplated scope of the invention.

FIG. 2A depicts a cross-sectional view of a semiconductor structure 200 along a first direction (along gate, in Fin Region) during an intermediate operation of a method of fabricating a semiconductor device according to one or more embodiments of the invention. FIG. 2B depicts a cross-sectional view of the semiconductor structure 200 along a second direction (across gate, in STI Region) during an intermediate operation of a method of fabricating a semiconductor device according to one or more embodiments of the invention. As depicted in FIGS. 2A and 2B, a partially fabricated semiconductor device can include one or more semiconductor fins 202 formed over a substrate (not depicted). Each of the semiconductor fins 202 can have a height ranging from 1 nm to 150 nm, for example, from 10 nm to 50 nm. In some embodiments of the present invention, the semiconductor fins 202 have a height of about 12 nm. The semiconductor fins 202 can be made of any suitable semiconductor channel material, such as, for example, monocrystalline silicon, silicon germanium, III-V compound semiconductor, or II-VI compound semiconductor. In some embodiments of the invention, the semiconductor fins 202 are made of silicon for an n-type device (NFET) and silicon germanium for a p-type device (PFET).

The semiconductor fins 202 can be formed by a variety of methods, such as, for example, ultrahigh vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing CVD (LRPCVD), and MBE. In some embodiments of the present invention, the semiconductor fins 202 are epitaxially grown from gaseous or liquid precursors. Epitaxial semiconductor materials can be grown using vapor-phase epitaxy (VPE), MBE, liquid-phase epitaxy (LPE), or other suitable processes. Epitaxial silicon and SiGe can be doped during deposition (in-situ doped) by adding n-type dopants (e.g., phosphorus or arsenic) or p-type dopants (e.g., Ga, B, $BF_2$, or Al). The dopant concentration in the doped regions can range from $1\times10^{19}$ $cm^{-3}$ to $2\times10^{21}$ $cm^{-3}$, or between $1\times10^{20}$ $cm^{-3}$ and $1\times10^{21}$ $cm^{-3}$.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments of the present invention, epitaxial growth and/or deposition processes are selective to forming on semiconductor surface, and generally do not deposit material on other exposed surfaces, such as silicon dioxide or silicon nitride surfaces.

In some embodiments of the present invention, the gas source for the deposition of epitaxial semiconductor material includes a silicon containing gas source, a germanium containing gas source, or a combination thereof. For example, an epitaxial Si layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. An epitaxial silicon germanium alloy layer can be formed utilizing a combination of such gas sources. Carrier gases like hydrogen, nitrogen, helium and argon can be used. In some embodiments of the present invention, the doped regions include silicon. In some embodiments of the present invention, the doped regions include carbon doped silicon (Si:C). This Si:C layer can be grown in the same chamber used for other epitaxy steps or in a dedicated Si:C epitaxy chamber. The Si:C can include carbon in the range of about 0.2 percent to about 3.0 percent.

The substrate (not depicted) can be made of any suitable substrate material, such as, for example, monocrystalline Si, SiGe, SiC, III-V compound semiconductor, II-VI compound semiconductor, or semiconductor-on-insulator (SOI). In some embodiments of the present invention, the substrate includes a buried oxide layer. The buried oxide layer can be made of any suitable dielectric material, such as, for example, a silicon oxide. In some embodiments of the present invention, the buried oxide layer is formed to a thickness of about 145 nm, although other thicknesses are within the contemplated scope of the invention.

The semiconductor fins 202 can be electrically isolated from other regions of the substrate by a shallow trench isolation 204. The shallow trench isolation 204 can be made of any suitable material, such as, for example, a low-k dielectric, a nitride, silicon nitride, silicon oxide, SiON, SiC, SiOCN, or SiBCN. In some embodiments of the present invention, the shallow trench isolation is SiO2.

As depicted in FIG. 2A, a gate including a high-k dielectric film 206 and a work function metal 208 is formed over a channel region of the semiconductor fins 202 in the Fin Region. The gate (also referred to as a metal gate, or conductive gate) can be made of any suitable conducting material, such as, for example, metal (e.g., tungsten, titanium, tantalum, ruthenium, zirconium, cobalt, copper, aluminum, lead, platinum, tin, silver, gold), conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), conductive carbon, graphene, or any suitable combination of these materials. The conductive material can further include dopants that are incorporated during or after deposition.

In some embodiments of the present invention, the gate is a high-k metal gate (HKMG) and the high-k dielectric film 206 is formed between the semiconductor fins 202 and the work function metal 208. The high-k dielectric film 206 can be used to modify the work function of the gate. The high-k dielectric film 206 can be made of, for example, silicon oxide, silicon nitride, silicon oxynitride, boron nitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials can further include dopants such as lanthanum and aluminum. In some embodiments of the present invention, the high-k dielectric film 206 can have a thickness of about 0.5 nm to about 4 nm. In some embodiments of the present invention, the high-k dielectric film 206 has a thickness of about 2 nm, although other thicknesses are within the contemplated scope of the invention.

The work function metal 208 is formed between the high-k dielectric film 206 and the bulk gate material (not depicted). The work function metal 208 can be made of, for example, aluminum, lanthanum oxide, magnesium oxide, strontium titanate, strontium oxide, titanium nitride, tantalum nitride, hafnium nitride, tungsten nitride, molybdenum nitride, niobium nitride, hafnium silicon nitride, titanium aluminum nitride, tantalum silicon nitride, titanium aluminum carbide, tantalum carbide, and combinations thereof.

For example, the work function metal 208 can be TiN or TiN/TiC. The work function metal 208 can serve to further modify the work function of the gate. In some embodiments of the present invention, the work function metal 208 can be formed to a thickness of about 2 to 10 nm, although other thicknesses are within the contemplated scope of the invention.

As depicted in FIG. 2B, in the shallow trench isolation region (STI Region) the high-k dielectric film 206 and work function metal 208 are conformally formed over spacers 210 (also known as sidewall spacers or gate spacers) and an interlayer dielectric 212. A portion of the high-k dielectric film 206 and work function metal 208 partially fill a trench between the spacers 210. The trench can have a critical dimension (width) of 2 nm to 100 nm or more, although other critical dimensions are within the contemplated scope of the invention. In some embodiments of the present invention, the trench has a critical dimension of less than 10 nm.

The spacers 210 are formed on sidewalls of the gate and are in direct contact with the high-k dielectric film 206. In some embodiments of the present invention, the spacers 210 are formed using a CVD, PECVD, ALD, PVD, chemical solution deposition, or other like processes in combination with a wet or dry etch process. The spacers 210 can be made of any suitable material, such as, for example, a low-k dielectric, a nitride, silicon nitride, silicon oxide, SiON, SiC, SiOCN, or SiBCN. The spacers 210 can be formed to a thickness of about 5 to 10 nm, although other thicknesses are within the contemplated scope of the invention.

The interlayer dielectric 212 is formed over the shallow trench isolation 204. The interlayer dielectric 212 can be made of any suitable material, such as, for example, porous silicates, carbon doped oxides, silicon dioxides, silicon nitrides, silicon oxynitrides, or other dielectric materials. Any known manner of forming the interlayer dielectric 212 can be utilized, such as, for example, CVD, PECVD, ALD, flowable CVD, spin-on dielectrics, or PVD. In some embodiments of the present invention, the interlayer dielectric 212 is planarized to a top surface of the spacers 210, using, for example, a CMP process.

Metal contacts (not depicted) can be formed on top of the gate and source and drain regions (not depicted). The contacts can be of any suitable conducting material, such as, for example, metal (e.g., tungsten, titanium, tantalum, ruthenium, zirconium, cobalt, copper, aluminum, platinum), conducting metallic compound material (e.g., tantalum nitride, titanium nitride, tantalum carbide, titanium carbide, titanium aluminum carbide, tungsten silicide, tungsten nitride, cobalt silicide, nickel silicide), conductive carbon, or any suitable combination of these materials. The conductive material can further include dopants that are incorporated during or after deposition. In some embodiments, the contacts can be copper and can include a barrier metal liner. The barrier metal liner prevents the copper from diffusing into, or doping, the surrounding materials, which can degrade their properties. Examples include tantalum nitride and tantalum (TaN/Ta), titanium, titanium nitride, cobalt, ruthenium, and manganese.

Figures 3A, 3B:
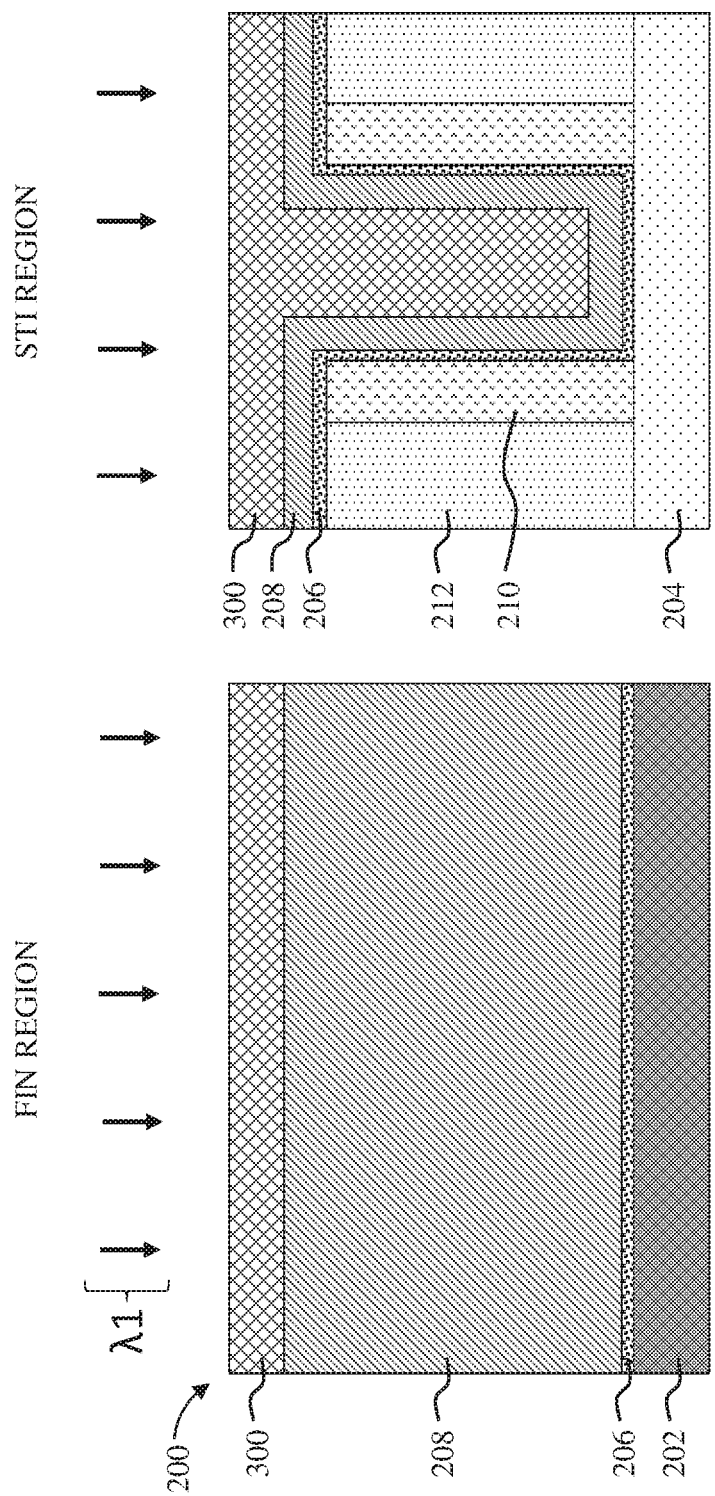
FIG. 3A depicts a cross-sectional view of the semiconductor structure after a processing operation according to one or more embodiments of the invention.
FIG. 3B depicts a cross-sectional view of the semiconductor structure after a processing operation according to one or more embodiments of the invention.

FIG. 3A depicts a cross-sectional view of the semiconductor structure 200 along the first direction (along gate, in Fin Region) after forming a UV sensitive OPL 300 over the work function metal 208 during an intermediate operation of a method of fabricating a semiconductor device according to one or more embodiments of the invention. The UV sensitive OPL 300 can be made of any UV sensitive material, as discussed previously herein. In some embodiments of the present invention, the UV sensitive OPL 300 can include a cinnamonyl, coumarin, or anthracene functional group covalently bonded to a polymer main chain, although it is understood that any UV sensitive OPL material can be used. The polymer main chain can include, for example, polystyrenes, polyethylenes, polyacrylates, polyamides, polyethers, polyesters, poly(N-acetylethylenimine), polyurethanes, and polyoxazoline.

The UV sensitive OPL 300 can be formed using any suitable process, such as, for example, a blanket coat or a spin-on process. After forming the UV sensitive OPL 300, a UV exposure is used to crosslink the UV sensitive OPL 300 according to one or more embodiments of the present invention. In some embodiments of the present invention, the UV sensitive OPL 300 is crosslinked using a UV exposure having a frequency of about 365 nm, although other crosslinking frequencies are within the contemplated scope of the invention.

FIG. 3B depicts a cross-sectional view of the semiconductor structure 200 along the second direction (across gate, in STI Region) after forming the UV sensitive OPL 300 during an intermediate operation of a method of fabricating a semiconductor device according to one or more embodiments of the invention. As depicted in FIG. 3B, the UV sensitive OPL 300 fills the remaining portions of the trench. As discussed previously herein, the trench can have a critical dimension of less than 10 nm. In this manner, the UV sensitive OPL 300 can serve to planarize a top surface of the semiconductor structure 200, even when the semiconductor structure 200 includes relatively small (sub-10 nm) feature sizes.

FIG. 4A depicts a cross-sectional view of the semiconductor structure 200 along the first direction (along gate, in Fin Region) after forming an antireflective coating 400 and photoresist 402 over the UV sensitive OPL 300 during an intermediate operation of a method of fabricating a semiconductor device according to one or more embodiments of the invention. FIG. 4B depicts a cross-sectional view of the semiconductor structure 200 along the second direction (across gate, in STI Region) after forming the antireflective coating 400 and photoresist 402 over the UV sensitive OPL 300 during an intermediate operation of a method of fabricating a semiconductor device according to one or more embodiments of the invention.

The UV sensitive OPL 300, antireflective coating 400 and photoresist 402 together define a tri-layer patterning stack. The antireflective coating 400 can be made of any suitable antireflective material, such as, for example, a low temperature oxide (LTO), SiARC, TiARC, or SiON. The antireflective coating 400 can be deposited using, for example, a spin-on process. The photoresist 402 can be made of any suitable resist material, such as, for example, a light sensitive polymer, and can be deposited using any suitable resist process.

FIG. 5A depicts a cross-sectional view of the semiconductor structure 200 along the first direction (along gate, in Fin Region) after patterning the UV sensitive OPL 300 during an intermediate operation of a method of fabricating a semiconductor device according to one or more embodiments of the invention. As depicted in FIG. 5A, a surface of the work function metal 208 is exposed in the Fin Region after patterning the UV sensitive OPL 300. The UV sensitive OPL 300 can be patterning using any suitable process, such as a conventional OPL dry etch, a wet etch, or a combination thereof.

FIG. 5B depicts a cross-sectional view of the semiconductor structure 200 along the second direction (across gate, in STI Region) after patterning the UV sensitive OPL 300 during an intermediate operation of a method of fabricating a semiconductor device according to one or more embodiments of the invention. As depicted in FIG. 5B, the trench between the spacers 210 remains filled with the UV sensitive OPL 300 after patterning the UV sensitive OPL 300 in the Fin Region.

FIGS. 6A and 6B depict cross-sectional views of the semiconductor structure 200 along the first direction (along gate, in Fin Region) and the second direction (across gate, in STI Region), respectively, after removing exposed portions of the work function metal 208 in the Fin Region and de-crosslinking the UV sensitive OPL 300 during an intermediate operation of a method of fabricating a semiconductor device according to one or more embodiments of the invention.

As depicted in FIG. 6A, the exposed portions of the work function metal 208 are removed, exposing a surface of the high-k dielectric film 206. The work function metal 208 can be patterned using any suitable process, such as, for example, a wet etch, a dry etch, or a combination of sequential wet and/or dry etches. In some embodiments of the present invention, portions of the work function metal 208 are removed using a RIE. In some embodiments of the present invention, portions of the work function metal 208 are removed selective to the UV sensitive OPL 300 and/or the high-k dielectric film 206.

After patterning the work function metal 208, the UV sensitive OPL 300 is de-crosslinked according to one or more embodiments of the present invention, forming a UV sensitive OPL 600. As discussed previously herein, a UV curing process can be used to de-crosslink the UV sensitive OPL 300. In some embodiments of the present invention, the UV sensitive OPL 300 is de-crosslinked using a UV exposure having a frequency of about 248 nm, although other de-crosslinking frequencies are within the contemplated scope of the invention. The cure time (UV exposure time) during the de-crosslinking process changes as a function of the thickness of the UV sensitive OPL 300.

FIG. 7A depicts a cross-sectional view of the semiconductor structure 200 along the first direction (along gate, in Fin Region) after removing the de-crosslinked UV sensitive OPL 600 during an intermediate operation of a method of fabricating a semiconductor device according to one or more embodiments of the invention. As depicted in FIG. 7A, a patterned surface of the work function metal 208 is exposed in the Fin Region after removing the UV sensitive OPL 600.

As discussed previously herein, the de-crosslinked UV sensitive OPL 600 can be cleanly removed without resorting to a dry removal process (RIE or plasma ash) and without requiring SPM. Instead, the UV sensitive OPL 600 can be removed using a wet stripping (solvent-based) process. In some embodiments of the present invention, the solvent can include silicone oil (QZ), normal butyl alcohol (NBA), gamma-butyrolactone (GBL), isopropyl alcohol (IPA), or propylene glycol monomethyl ether acetate (PGMEA), although other solvents are within the contemplated scope of the invention. Advantageously, the de-crosslinked UV sensitive OPL 600 can be removed in this manner without exposing the work function metal 208 or the high-k dielectric film 206 to a potentially damaging etching process (e.g., a RIE).

FIG. 7B depicts a cross-sectional view of the semiconductor structure 200 along the second direction (across gate, in STI Region) after removing the de-crosslinked UV sensitive OPL 600 during an intermediate operation of a method of fabricating a semiconductor device according to one or more embodiments of the invention. As depicted in FIG. 7B, the de-crosslinked UV sensitive OPL 600 is cleanly removed from the trench between the spacers 210 after the wet stripping process. As discussed previously herein, the availability of a UV sensitive OPL that can be cleanly removed from small feature sizes (such as a trench having less than 10 nm critical dimension) using a crosslinking/de-crosslinking process is critical to scale photolithography techniques beyond the 10 nm node.

Figure 8:
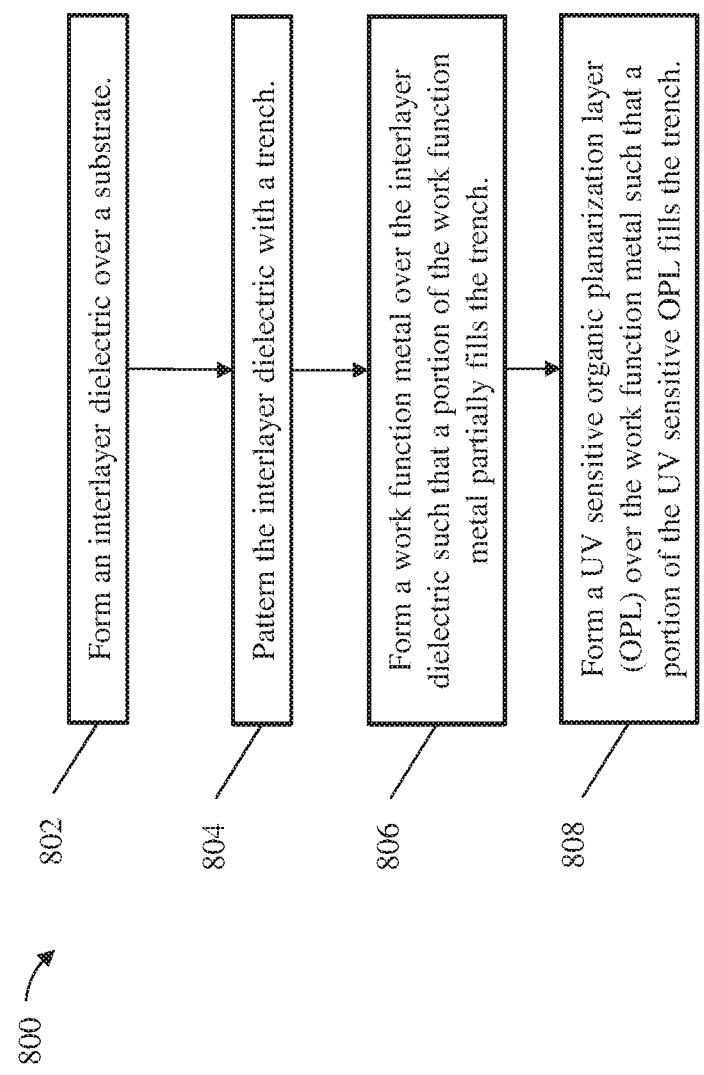
FIG. 8 depicts a flow diagram illustrating a method according to one or more embodiments of the invention.

FIG. 8 depicts a flow diagram 800 illustrating a method for forming a semiconductor device according to one or more embodiments of the invention. As shown at block 802, an interlayer dielectric is formed over a substrate. The interlayer dielectric is patterned with a trench at block 804. In some embodiments of the present invention, the interlayer dielectric is formed in an STI Region of the substrate as previously discussed herein (FIGS. 2A and 2B).

At block 806, a work function metal is formed over the interlayer dielectric such that a portion of the work function metal partially fills the trench. At block 808, a UV sensitive OPL is formed over the work function metal such that a portion of the UV sensitive OPL fills the trench. The UV sensitive OPL includes a functional group that can be crosslinked by applying light at a first UV frequency and de-crosslinked by applying light at a second UV frequency.

Figure 9:
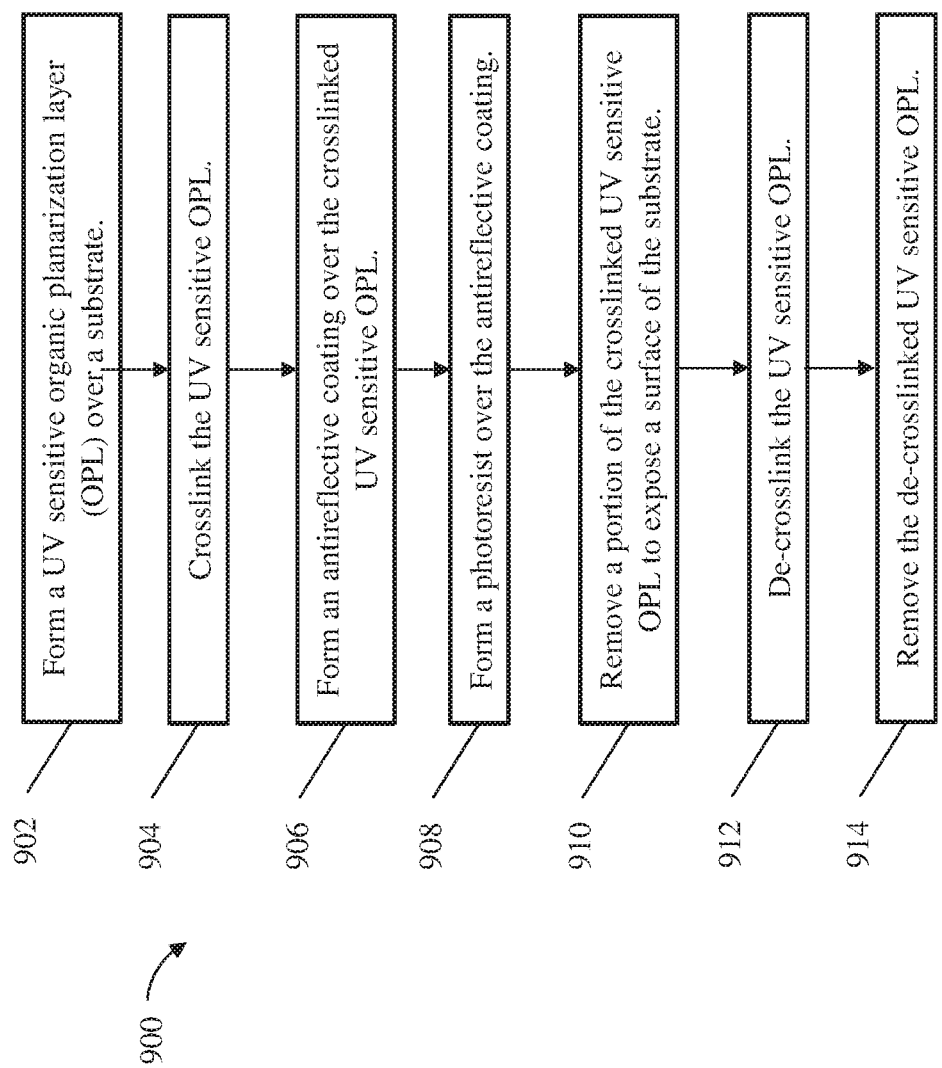
FIG. 9 depicts a flow diagram illustrating a method according to one or more embodiments of the invention.

FIG. 9 depicts a flow diagram 900 illustrating a method for forming a semiconductor device according to one or more embodiments of the invention. As shown at block 902, a UV sensitive OPL is formed over a substrate. The UV sensitive OPL is crosslinked, at block 904, according to one or more embodiments of the present invention.

At block 906, an antireflective coating is formed over the crosslinked UV sensitive OPL. A photoresist is formed, at block 908, over the antireflective coating. The UV sensitive OPL, the antireflective coating, and the photoresist together define a trilayer patterning stack as previously discussed herein.

The method includes, at block 910, removing a portion of the crosslinked UV sensitive OPL to expose a surface of the substrate. The trilayer stacked can be patterned according to one or more embodiments of the present invention.

At block 912, the UV sensitive OPL is de-crosslinked. In some embodiments of the present invention, the UV sensitive OPL is de-crosslinked using a UV curing process. The de-crosslinked UV sensitive OPL is removed at step 914.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, are used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (e.g., rotated 90 degrees or at other orientations), and the spatially relative descriptors used herein should be interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a {100} orientated crystalline surface can take on a {100} orientation. In some embodiments of the invention of the invention, epitaxial growth and/or deposition processes can be selective to forming on semiconductor surface, and may or may not deposit material on exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A semiconductor device comprising:
    a work function metal formed over a substrate; and
    a UV sensitive organic planarization layer (OPL) formed over the work function metal;
    wherein the UV sensitive OPL comprises a functional group that can be crosslinked by applying light at a first UV frequency and de-crosslinked by applying light at a second UV frequency.

2. The semiconductor device of claim 1, wherein the first UV frequency is higher than the second UV frequency.

3. The semiconductor device of claim 2, wherein the first UV frequency is about 365 nm.

4. The semiconductor device of claim 2, wherein the second UV frequency is about 248 nm.

5. The semiconductor device of claim 1, wherein the functional group comprises cinnamoyl, coumarin, anthracene, or a combination thereof.

6. The semiconductor device of claim 5, wherein the functional group is covalently bonded to a polymer.

7. The semiconductor device of claim 6, wherein the polymer comprises a polystyrene, polyethylene, polyacrylate, polyamide, polyether, polyester, poly(N-acetylethylenimine), polyurethane, polyoxazoline, or a combination thereof.

8. A semiconductor device comprising:
    an interlayer dielectric over a substrate;
    a trench in the interlayer dielectric;
    a work function metal over the interlayer dielectric, a portion of the work function metal partially filling the trench; and
    a UV sensitive organic planarization layer (OPL) over the work function metal, a portion of the UV sensitive OPL filling the trench;
    wherein the UV sensitive OPL comprises a functional group that can be crosslinked by applying light at a first UV frequency and de-crosslinked by applying light at a second UV frequency.

9. The semiconductor device of claim 8, wherein the first UV frequency is higher than the second UV frequency.

10. The semiconductor device of claim 9, wherein the first UV frequency is about 365 nm.

11. The semiconductor device of claim 9, wherein the second UV frequency is about 248 nm.

12. The semiconductor device of claim 8, wherein the functional group comprises cinnamoyl, coumarin, anthracene, or a combination thereof.

13. The semiconductor device of claim 12, wherein the functional group is covalently bonded to a polymer.

14. The semiconductor device of claim 13, wherein the polymer comprises a polystyrene, polyethylene, polyacrylate, polyamide, polyether, polyester, poly(N-acetylethylenimine), polyurethane, polyoxazoline, or a combination thereof.

15. The semiconductor device of claim 8, wherein the work function metal is patterned.

16. The semiconductor device of claim 8, wherein a first portion of the UV sensitive OPL is crosslinked.

17. The semiconductor device of claim 16, wherein the first portion of the UV sensitive OPL is crosslinked using a UV curing process at the first UV frequency.

18. The semiconductor device of claim 8, wherein a second portion of the UV sensitive OPL is de-crosslinked.

19. The semiconductor device of claim 18, wherein the second portion of the UV sensitive OPL is de-crosslinked using a UV curing process at the second UV frequency.

20. The semiconductor device of claim 19, wherein a portion of the de-crosslinked UV sensitive OPL is patterned to expose a surface of the work function metal.

* * * * *